United States Patent [19]

Newell

[11] 4,119,902

[45] Oct. 10, 1978

[54] ACCELERATION/DECELERATION CONTROL CIRCUIT FOR A STEPPING MOTOR

[75] Inventor: Harold R. Newell, South Newbury, N.H.

[73] Assignee: Mesur-Matic Electronics Corp., Salem, Mass.

[21] Appl. No.: 814,072

[22] Filed: Jul. 8, 1977

[51] Int. Cl.² .............................................. H03K 1/16
[52] U.S. Cl. ...................................... 318/696; 328/44
[58] Field of Search ............... 318/696, 685, 254, 138, 318/415; 328/44

[56] References Cited
U.S. PATENT DOCUMENTS

| | | | |
|---|---|---|---|
| 3,886,459 | 5/1975 | Hufford et al. ....................... | 318/696 |
| 3,899,729 | 8/1975 | Emery ................................... | 318/696 |

Primary Examiner—Herman Hohauser
Attorney, Agent, or Firm—Pollock, Vande Sande & Priddy

[57] ABSTRACT

An acceleration/deceleration control circuit for a stepping motor includes a plural stage up/down counter connected to a source of pulses of constant repetition rate. The up/down counter output is connected to a decoder, such as a digital/analog converter, and conventionally, the output of the decoder is coupled to a variable rate oscillator, whose frequency increases, for example, as the output voltage of the digital/analog converter increases, and vice versa. The variable rate output is provided as an input to the stepping motor. In the improved arrangement a series RC circuit is coupled to the output of the decoder and the input of the variable rate oscillator is connected across the capacitor.

5 Claims, 4 Drawing Figures

ACCELERATION/DECELERATION CONTROL CIRCUIT FOR A STEPPING MOTOR

FIELD OF THE INVENTION

The present invention relates to control circuits for stepping motors, and more particularly, such circuits to control acceleration and/or deceleration of the stepping motor.

BACKGROUND OF THE INVENTION

Stepping motors are available in which the motor rotates a predetermined amount in response to a single input pulse. The rate of motor rotation is therefore proportional to the repitition rate of the input pulses. Typically, the input pulses are metered or counted, such that a pulse group with a given number of pulses will rotate the motor a predetermined amount. Such arrangements are useful in positioning systems in a wide variety of fields.

Since the stepping motor is limited in the rate at which it can properly respond to input pulses, the input pulse repitition rate and therefore the rate at which the motor can be stepped is likewise limited. However, while the stepping motor has a first pulse repitition rate limit as the limiting rate of input pulses which can properly start if from rest, the motor can be induced to step at a higher velocity than that associated with this rate limit, if the rate of input pulses can be gradually increased. Like remarks apply to deceleration as well. Accordingly, acceleration/deceleration control circuits have been provided in the prior art, such as that disclosed in U.S. Pat. No. 3,579,279.

As disclosed, a source of constant rate input pulses are provided to a control circuit which includes a plural stage up/down counter. A variable rate pulse source is controlled in rate by the output of a digital to analog converter connected to the output of the counter. The pulse source output is supplied as an input to the stepping motor and is also fed back and coupled to the up/down counter to count the counter down. This arrangement is effective to alleviate to some extent the problems caused by the limited rate response of the stepping motor. As a group of constant rate pulses is first applied to the up/down counter, the counter begins counting up. In the initial stages of the up counting operation, the output of the digital/analog converter begins to increase from zero at a constant rate. As the output of the digital/analog converter first moves above zero, the variable rate pulse source begins emitting pulses, and as the voltae increases, so then does the pulse rate. However, as soon as the pulse source begins emitting pulses, it starts to count down the up/down counter so that the rate of increase in the count of the counter begins to decrease. In this fashion, the pulse source rate change begins slowing down until an equilibrium condition is reached at which the pulse source rate matches the input pulse rate. This is a stable condition and will continue for so long as the input pulses are present. When the input pulses disappear, however, the counter begins counting down rapidly. As the count in the counter changes in the downward direction, of course, the rate of the pulse source also changes, thus decreasing the rate at which the pulse rate changes. One result of the control circuit is that it emits the identical number of pulses as are applied to it and thus the stepping motor is moved through the desired angle. Also, the abrupt changes in pulse rate are "smoothed" to some extent, allowing a higher input pulse rate than would be the case without the control circuit.

However, the output rate of the pulse source, i.e., the pulses actually applied to the stepping motor, still exhibit abrupt changes especially at the initial acceleration and at initial deceleration times. In addition, the exponential fall also results in undesirably long time for stopping. Thus, while the prior art control circuits do allow the use of higher input pulse rates, there is still a desire to improve the response of the overall arrangement such that even higher input rates can be employed.

It is therefore one object of the present invention to provide an accelerationdeceleration control for a stepping motor which "smooths" the rate changes of the prior art arrangements. It is another object of the present invention to improve the prior art acceleration/deceleration control circuits of stepping motors to allow higher input pulse rates to be employed without causing the stepping motor to fall out of step.

SUMMARY OF THE INVENTION

These and other objects of the invention are met in accordance with the invention, by providing a delay means, or an integrating circuit between the output of the digital/analog converter and the input to the variable rate pulse source. This delay means or integrating circuit has the advantage of smoothing or softening the abrupt pulse rate changes and allows a higher input pulse rate to be employed.

In a preferred embodiment of the invention, the delay means, or integrating circuit, comprises a series RC arrangement coupled to the output of the digital/analog converter with the input to the variable rate pulse source connected across the capacitor.

BRIEF DESCRIPTION OF THE DRAWINGS

The present invention will be described in more detail in connection with the attached drawings in which like reference characters identify identical apparatus and in which.

DETAILED DESCRIPTION OF A PREFERRED EMBODIMENT

Figure 1A:
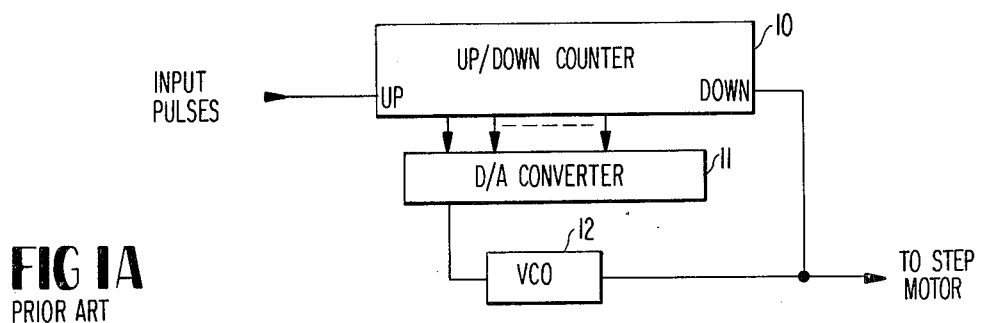
FIG. 1A is a block diagram of the prior art acceleration/deceleration control for a stepping motor.

FIG. 1 A is a block diagram illustration of a typical prior art acceleration/deceleration control circuit. As shown in FIG. 1, an input source of constant rate pulses is coupled to an UP input of a plural stage up/down counter 10. Plural outputs from the counter 10 are coupled as inputs to a digital to analog converter 11, the output of which is coupled as an input to a voltage controlled oscillator 12. The voltage controlled oscillator 12 is arranged to have the input voltage control the repetition rate of its pulse output. The output of the voltage controlled oscillator 12 is provided as an input to the stepping motor and is also coupled to the count down input of the up/down counter 10.

In operation, assume that the up/down counter has a zero count therein and the stepping motor is stationary when a group of pulses is applied to the UP input terminal of the counter 10. As the counter 10 begins responding to the input pulses by counting up, the output voltage of the D/A converter 11 begins to increase from zero. Accordingly, the voltage controlled oscillator 12 begins producing output pulses at an increasing rate, in accordance with the increases in the output voltage of the digital to analog converter 11. Since the input pulses are provided at a constant rate, the counter initially counts up rapidly, and as the pulse rate of the VCO 12 increases, the rate of increase in the counter status begins to decrease, although the counter continues to count up. The result is a rapid rise in the pulse rate of the VCO and then a levelling off of its increase in repitition rate as a function of time. For proper parameters equilibrium is reached when the repetition rate of the input pulses matches the repetition rate of the VCO and the counter 10 maintains some count, which is necessary to maintain the equilibrium. Accordingly, the pulse rate output of the VCO becomes stationary. When the input pulses terminate, equilibrium disappears. Under these circumstances, the up/down counter 10 is still subjected to a counting down input as the equilibrium rate, but now there is no longer any signal to count the counter up. Accordingly, the counter begins counting down at a rapid rate, and thus the repetition rate of the VCO output changes rapidly. At the same time, however, as the count in counter 10 decreases, the repetition rate of the VCO also decreases and the rate is gradually decreased to zero.

Figure 1B:
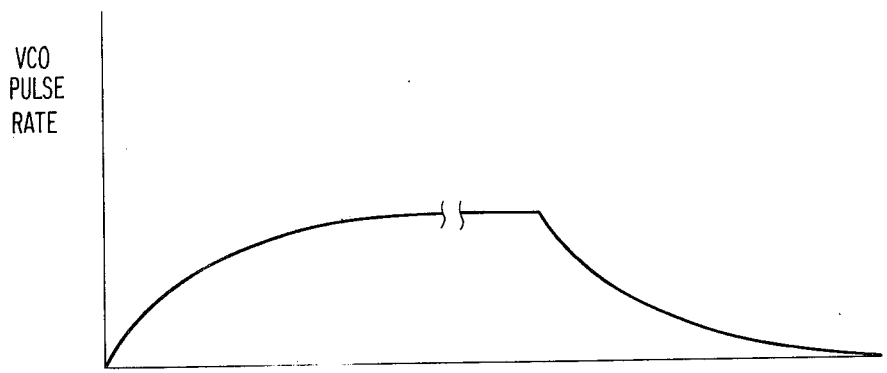
FIG. 1B illustrates the output pulse rate of the prior art control circuit as a function of time.

The repetition rate of the VCO output as a function of time is shown in FIG. 1B. As explained, the repetition rate initially increases and then levels off. Actually the repetition rate takes the form of an exponential. Similar action occurs when the input pulses terminate and now the repetition rate undergoes an exponential decrease.

Figure 2A:
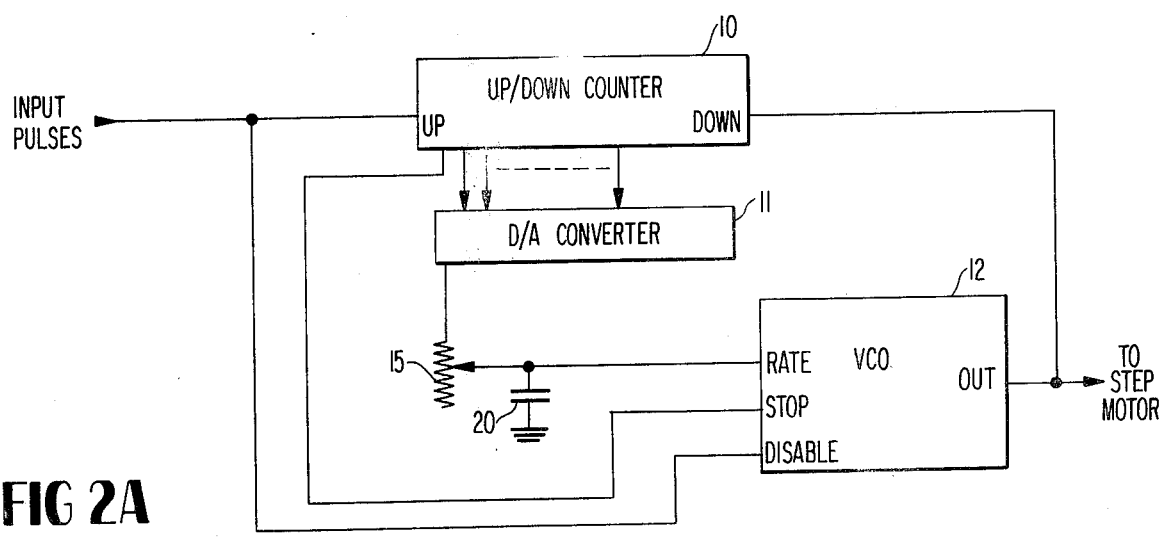
FIG. 2 is a part block, part schematic diagram illustrating the control circuit of the present invention.
FIG. 2B illustrates the output pulse rate of the inventive circuit as a function of time.

The initial slope of the acceleration and deceleration curve of FIG. 1B is, of course, related to the repetition rate of the input pulses. Accordingly, the repetition rate of the input pulses is limited inasmuch as the initial slope of the FIG. 1B curve must be limited in accordance with the frequency response of the step motor. Thus, one area for improvement is the initial slopes of the aceleration and deceleration portions of the curve shown in FIG. 1B. At the same time, the exponential form of this curve results in undesirably long acceleration and deceleration times. Accordingly, it is desirable to linearize the curve of FIG. 1B. That function is accomplished in accordance with the apparatus shown in FIG. 2.

As shown in FIG. 2, the same up/down counter 10 is coupled to the D/A converter 11, the output of which is coupled to VCO 12, the VCO 12 output is coupled to the down input of the counter 10, and the input pulse's line is connected to the up input for the counter 10. The same line is connected to the disable input of the VCO. This is desirable to prevent the up/down counter from being subjected to simultaneous up and down counts. Thus, the VCO output 12 is disabled in the presence of an input pulse. An additional output of the counter 10, its zero output, is coupled to the stop input of VCO 12 to insure the VCO is disabled when the counter is counted down to zero.

In order to linearize the FIG. 1B curve, the D/A converter 11 output is coupled to a resistor shown in FIG. 2 as a potentiometer 15. The potentiometer 15 has a tap coupled to one terminal of a capacitor 20, the other terminal of which may be grounded. The junction of capacitor 20 and potentiometer 15 is coupled to the rate input of the VCO 12. The RC circuit comprising potentiometer 15 and capacitor 20 thus forms a delay means or an integrating circuit which has the effect of linearizing the voltage provided to the rate input of the VCO 12. By varying the potentiometer setting the slope of the input voltage to the rate input of VCO 12 can be altered. For a fixed system, of course, the potentiometer is replaced by a resistor.

In operation, again assume that the stepping motor is stationary, the up/down counter contains the count of zero and thus the VCO 12 is disabled. At the initiation of a pulse group, the counter again counts up rapidly. This produces a rapid rise in the output of the digital to analog converter 11, but now the voltage actually applied to the rate input of the VCO 12 is "smoothed" by the RC network, thus "linearizing" the pulse repetition rate of the VCO output.

When the input pulse group terminates, the VCO 12 is providing output pulses at a predetermined rate, and the counter is counted down initially at that relatively high rate. This produces a rapid drop in the output voltage of the digital to analog converter 11, but again, that rapid drop in voltage is not seen by the rate input of the VCO 12. Rather, the input voltage to the rate of input of the VCO 12 is again "smoothed" by the RC network.

Figure 2B:
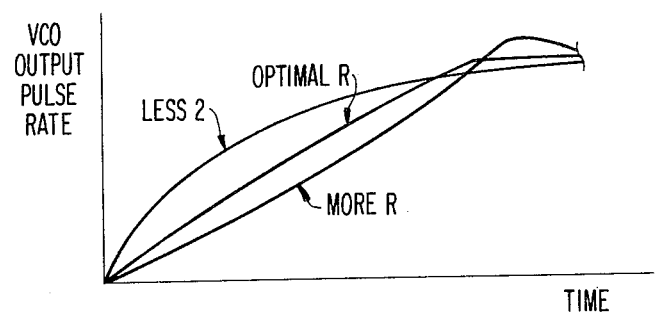

FIG. 2B illustrates the effect of varying the in circuit resistance of the potentiometer 15. FIG. 2B is a plot of VCO output pulse rate as a function of time for the FIG. 2A arrangement subjected to an input pulse group at a constant rate. With low resistance the curve is similar to FIG. 1B, as the resistance is increased an optimal condition is reached which has minimal initial slope, allowing high input pulse rate, and which rapidly reaches an equilibrium. As the resistance is further increased, overshoot is exhibited. This is detrimental in that it increases the time delay in settling down to equilibrium. The deceleration mode illustrates the same relationship as the resistance is varied.

What is claimed is:

1. An improved acceleration control for a stepping motor which includes a source of pulses of constant frequency, a plural stage up/down counter with one input for stepping said counter is one direction connected to said source of pulses, decoding means connected to plural stage outputs of said counter for providing a voltage corresponding to a count stored in said counter, a variable frequency oscillator responsive to said voltage for providing pulses at a rate related to said voltage, said variable frequency oscillator having an output supplying pulses to said stepping motor, said output also connected to a further input of said plural stage up/down counter for stepping said counter in another direction wherein the improvement comprises integrating means connected between said decoder means and said variable frequency oscillator.

2. The apparatus of claim 1 wherein said integrating means comprises serially connected resistor and capacitor, with said variable frequency oscillator connected across said capacitor.

3. A pulse control circuit for smoothing pulse rate changes between an input line and an output line when said input line is subjected to discrete pulse groups each of which includes pulses at a fixed repetition rate, said control circuit comprising:
    a plural stage up/down counter with said input line connected to an up counting input thereof, a digital to analog converter connected to outputs of plural stages of said counter, a series resistance-capacitance circuit connected to said digital to analog converter, a variable repetition rate pulse source having a control input for controlling pulse repetition rate of output pulses produced thereby and connected to said capacitance, said variable repetition rate pulse source having an output coupled to said output line and to a down count input of said counter.

4. The circuit of claim 3 in which said up/down counter has a zero count output, said variable rate pulse source has a stop input, with said zero count output connected thereto.

5. The apparatus of claim 3 in which said variable rate pulse source has a disable input coupled to said input line.

* * * * *

UNITED STATES PATENT AND TRADEMARK OFFICE
CERTIFICATE OF CORRECTION

PATENT NO. : 4,119,902
DATED : October 10, 1978
INVENTOR(S) : Harold R. Newell

It is certified that error appears in the above–identified patent and that said Letters Patent are hereby corrected as shown below:

Figure 2B  -  "Less 2" should read --Less R--

In column 1, line 51, correct the spelling of "voltage".

Signed and Sealed this

Twentieth Day of February 1979

[SEAL]

Attest:

RUTH C. MASON
Attesting Officer

DONALD W. BANNER
Commissioner of Patents and Trademarks